United States Patent
Araki et al.

(10) Patent No.: US 6,181,535 B1
(45) Date of Patent: Jan. 30, 2001

(54) MAGNETORESISTANCE EFFECT HEAD OBTAINED USING A PULSE MAGNETIC FIELD PROCESS

(75) Inventors: Satoru Araki, Saku; Haruyuki Morita, Komoro, both of (JP)

(73) Assignee: TDK Corporation, Tokyo (JP)

( * ) Notice: Under 35 U.S.C. 154(b), the term of this patent shall be extended for 0 days.

(21) Appl. No.: 09/260,722

(22) Filed: Mar. 2, 1999

(30) Foreign Application Priority Data

Mar. 6, 1998 (JP) .................................................. 10-073176

(51) Int. Cl.⁷ ....................................................... G11B 5/39
(52) U.S. Cl. ........................................ 360/324.11; 428/692
(58) Field of Search ....................................... 360/113, 324, 360/324.1, 324.11; 324/207.21, 252; 338/32 R; 428/692, 694 R, 694 TS, 694 TM, 900

(56) References Cited

U.S. PATENT DOCUMENTS

| | | | | |
|---|---|---|---|---|
| 5,214,840 | * | 6/1993 | Imagawa et al. | 29/603.08 |
| 5,465,185 | * | 11/1995 | Heim et al. | 360/113 |
| 5,717,550 | * | 2/1998 | Nepela et al. | 360/113 |
| 5,764,445 | * | 6/1998 | Torng et al. | 360/113 |
| 5,772,794 | * | 6/1998 | Uno et al. | 360/113 |
| 5,784,225 | * | 7/1998 | Saito et al. | 360/113 |
| 5,862,022 | | 1/1999 | Noguchi et al. | 360/113 |
| 5,869,963 | * | 2/1999 | Saito et al. | 324/252 |
| 5,910,344 | * | 6/1999 | Hasegawa et al. | 427/599 |
| 5,958,611 | * | 9/1999 | Ohta et al. | 428/692 |
| 5,959,810 | * | 9/1999 | Kakihara et al. | 360/113 |
| 5,972,420 | * | 10/1999 | Saito et al. | 427/130 |
| 5,974,657 | * | 11/1999 | Fox et al.1 | 29/603.08 |
| 5,976,713 | * | 11/1999 | Fuke et al. | 428/692 |
| 5,991,125 | * | 11/1999 | Iwasaki et al. | 360/113 |
| 6,010,781 | * | 1/2000 | Aoshima et al. | 428/332 |
| 6,033,491 | * | 3/2000 | Lin | 148/108 |
| 6,090,498 | * | 9/1999 | Omata et al. | 428/692 |

FOREIGN PATENT DOCUMENTS 10-242544   9/1998   (JP) .

* cited by examiner

*Primary Examiner*—Brian E. Miller
(74) *Attorney, Agent, or Firm*—Oblon, Spivak, McClelland, Maier & Neustadt, P.C.

(57) ABSTRACT

A magnetoresistance effect type head of the present invention has a spin valve type magnetoresistance effect film. A pulse magnetic field process is carried out wherein a pulse magnetic field of the pulse magnetic field intensity I of 5 kOe to 40 kOe is intermittently applied to the magnetoresistance effect film upon executing a so-called magnetization orthogonalization process. As a result, there can be obtained the magnetoresistance effect type head, wherein the orthogonalization of magnetization of a soft magnetic layer and a ferromagnetic layer is achieved under a very low temperature condition, i.e. without heating up to a blocking temperature Tb, and over a short time, so that deterioration of a magnetic characteristic is quite small, a head characteristic is stable and a head output is large.

11 Claims, 11 Drawing Sheets

FIG. 4
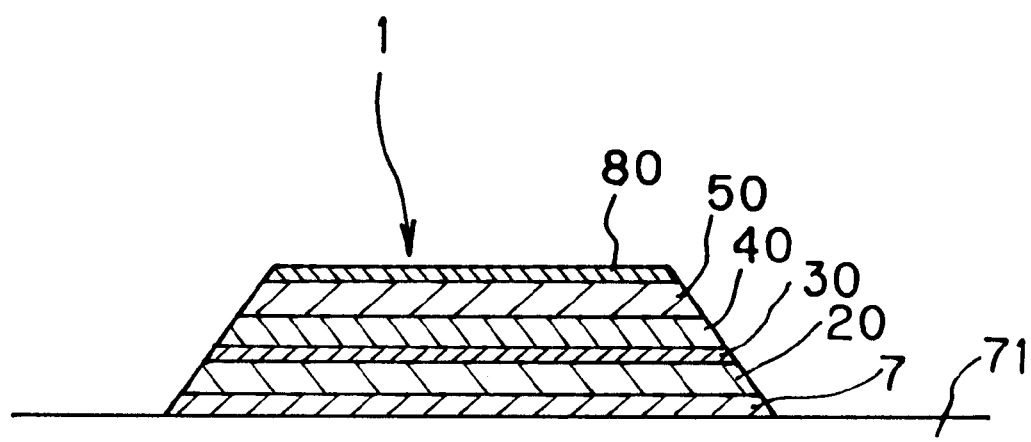
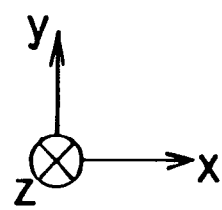

MAGNETORESISTANCE EFFECT HEAD OBTAINED USING A PULSE MAGNETIC FIELD PROCESS

BACKGROUND OF THE INVENTION

1. Field of the Invention

The present invention relates to a magnetoresistance effect type head using a magnetoresistance effect film for reading the magnetic field intensity of a magnetic recording medium or the like as a signal, particularly a spin-valve type magnetoresistance effect film which is capable of reading a small magnetic field change as a greater electrical resistance change signal.

2. Description of the Prior Art

Recently, there has been the development for increasing the sensitivity of magnetic sensors and increasing the density in magnetic recording and, following this, magnetoresistance effect type magnetic sensors (hereinafter referred to as MR sensors) and magnetoresistance effect type magnetic heads (hereinafter referred to as MR heads) using magnetoresistance change have been actively developed. Both MR sensors and MR heads are designed to read out external magnetic field signals on the basis of the variation in resistance of a reading sensor portion formed of magnetic material. The MR sensors have an advantage that a high sensitivity can be obtained and the MR heads have an advantage that a high output can be obtained upon reading out signals magnetically recorded in high density because the reproduced output does not depend on the relative speed of the sensors or heads to the recording medium.

However, conventional MR sensors which are formed of magnetic materials such as $Ni_{80}Fe_{20}$ (Permalloy), NiCo or the like have a small resistance change ratio $\Delta R/R$ which is about 1 to 3% at maximum, and thus these materials have insufficient sensitivity as the reading MR head materials for ultrahigh density recording of the order of several GBPSI (Giga Bits Per Square Inches) or more.

Attention has been recently paid to artificial lattices having the structure in which thin films of metal having a thickness of an atomic diameter order are periodically stacked, because their behavior is different from that of bulk metal. One of such artificial lattices is a magnetic multilayered film having ferromagnetic metal thin films and non-magnetic metal thin films alternately deposited on a substrate. Heretofore, magnetic multilayered films of an iron-chromium type, a cobalt-copper type and the like have been known. However, these artificial lattice magnetic multilayered films are not commercially applicable as they are because the external magnetic field at which a maximum resistance change occurs (operating magnetic field intensity), is as high as several tens of kilo-oersted.

Under these circumstances, a new structure which is called a spin valve has been proposed. In this structure, two NiFe layers are formed via a non-magnetic metal layer, and an FeMn layer is further formed so as to be adjacent to one of the NiFe layers.

In this case, since the FeMn layer and the NiFe layer adjacent thereto are directly exchange-coupled to each other, the direction of the magnetic spin of this NiFe layer is fixed in the range of several tens to several hundreds Oe in magnetic field intensity. On the other hand, the direction of the magnetic spin of the other NiFe layer is freely changeable by an external magnetic field. As a result, there can be achieved a magnetoresistance change ratio (MR ratio) of 2 to 5% in a small magnetic field range which corresponds to the degree of coercive force of the NiFe layer.

In the spin valve, by realizing a difference in relative angles of spins between two magnetic layers, the large MR change which differs from the conventional anisotropy magnetoresistance (AMR) effect is accomplished. This is realized by pinning of the magnetic layer spin due to the direct exchange coupling force between one of the magnetic layers and the antiferromagnetic layer. This exchange coupling can be the substance of the spin valve.

However, for putting the spin valve to practical use, there are various problems as described hereinbelow. The strength of the exchange coupling pinning the magnetic layer is represented by a magnitude of a unidirectional anisotropic magnetic field Hua which shifts. On the other hand, a temperature at which Hua is lost is set to be a blocking temperature Tb which represents a thermal stability. The generally used FeMn layers and other antiferromagnetic exchange coupling:

(1) The blocking temperature Tb is low, that is, in the range from 150 to 170° C. As compared with the state of the bulk, the blocking temperature Tb is low so that an excellent thin film which can fully achieve an expected pinning effect can not be obtained.

(2) Dispersion of the blocking temperatures Tb occurs. Specifically, because of a thin film, the film surface of the FeMn layer is composed of various crystal grains, and the individual crystal grains have their own blocking temperatures Tb. If all the crystal grains have the same blocking temperature Tb, no problem is raised. However, actually, some crystal grains have lower blocking temperatures Tb, while some crystal grains have higher blocking temperatures Tb. As a result, it is possible that there exist those grains with small exchange coupling which causes reversal of the spin in the ferromagnetic layer at 80 to 120° C. representing an operating temperature range on application (due to existence of crystal grains having lower blocking temperatures Tb). Then, the spin direction of the pinned ferromagnetic layer may be inclined as a whole so that the output voltage is lowered. Thus, it is desired that a high-quality antiferromagnetic thin film be provided wherein as many crystal grains as possible have the same high blocking temperature Tb.

For solving the foregoing problems, antiferromagnetic thin films made of $Ru_xM_yMn_z$ (M represents at least one selected from Rh, Pt, Pd, Au, Ag and Re) have been proposed as preferred examples in Japanese Patent Applications Nos. 8-357608 and 9-219121.

On the other hand, for causing a magnetoresistance effect film to function as a spin valve film, it is necessary to orthogonalize (ideally at 90 degrees) in advance magnetization directions of a soft magnetic layer and a ferromagnetic layer forming the magnetoresistance effect film. This orthogonalization process can be carried out by applying mutually orthogonal magnetic fields upon the formation of the soft magnetic layer and the ferromagnetic layer. However, due to an unavoidable heating step (for example, resist curing at 250° C. for 3 hours in total) in the manufacturing process after the formation of the film, the orthogonalization of magnetization is disturbed to largely deviate from ideal 90 degrees so that the MR ratio is lowered. As a result, there is raised a disadvantage that the sufficient output can not be achieved after assembled as a spin valve head. For this reason, it is desired that the orthogonalization process of magnetization directions be carried out at the end of the head manufacturing process. Specifically, it is necessary to heat the head, approximate to a final product, to no lower than a blocking temperature Tb and apply again magnetic fields for adjusting the spin directions of the magnetoresistance effect film. However, as described above, an antiferromagnetic layer having a high blocking temperature Tb is used for ensuring the high pinning effect. Thus, a heat treatment temperature for the orthogonalization is quite high, i.e. about 300° C., and required over a long time. The orthogonalization process at such a high temperature may cause mutual diffusion of substances between the thin film magnetic layers and lose an anisotropic magnetic field Hk of the soft magnetic layer so as to deteriorate a magnetic characteristic, thereby leading to a damage to the head. As a result, when an antiferromagnetic layer having a high blocking temperature Tb is used, the complete orthogonalization of magnetization of a soft magnetic layer and a ferromagnetic layer can not be realized so that the sufficient output of a spin valve head can not be obtained.

SUMMARY OF THE INVENTION

The present invention has been made under these circumstances and has an object to provide a magnetoresistance effect type head, wherein orthogonalization of magnetization of a soft magnetic layer and a ferromagnetic layer is achieved under a very low temperature condition, i.e. without heating up to a blocking temperature Tb, and for a short time, so that deterioration of a magnetic characteristic is quite small, a head characteristic is stable and a head output is large.

For solving the foregoing problems, according to the present invention, there is provided a magnetoresistance effect type head comprising a magnetoresistance effect film, conductive films and a gap portion, wherein the conductive films are conductively connected to the magnetoresistance effect film, wherein the magnetoresistance effect film is a spin valve type multilayered film which comprises a non-magnetic metal layer, a ferromagnetic layer formed on one surface of the non-magnetic metal layer, a soft magnetic layer formed on the other surface of the non-magnetic metal layer, and an antiferromagnetic layer which is formed on a surface of the ferromagnetic layer remote from a surface thereof abutting the non-magnetic metal layer so as to pin a direction of magnetization of the ferromagnetic layer, wherein the antiferromagnetic layer pins the direction of magnetization of the ferromagnetic layer, wherein the pinned magnetization direction of the ferromagnetic layer is forcibly controlled by a pulse magnetic field process so as to be substantially orthogonalized relative to a magnetization direction of the soft magnetic layer at the time of an external magnetic field being zero, the pulse magnetic field process intermittently applying a pulse magnetic field of a pulse magnetic field intensity I being 5 kOe to 40 kOe to the magnetoresistance effect film, and wherein the pinned magnetization direction of the ferromagnetic layer is in an angle range of 90±10 degrees relative to the magnetization direction of the soft magnetic layer at the time of the external magnetic field being zero.

It is preferable that the pulse magnetic field process is carried out in a state of the magnetoresistance effect film being heated in a temperature range of 0.3 Tb to 0.6 Tb where Tb represents a blocking temperature of the antiferromagnetic layer.

It is preferable that in the pulse magnetic field process, a pulse width t is set in a range of 1 msec$\leq$t$\leq$500 msec and a pulse period $\lambda$ is set in a range of 0.1 Hz$\leq\lambda\leq$10 Hz.

It is preferable that the antiferromagnetic layer is substantially made of $M_x Mn_{100-x}$ where M represents at least one selected from Ru, Rh, Re, Ir, Pt, Pd, Au, Ag, Fe, Ni and Cr, and 15$\leq$x$\leq$58 (unit of x: atomic %).

It is preferable that the antiferromagnetic layer is substantially made of $Ru_x M_y Mn_z$ where M represents at least one selected from Rh, Pt, Pd, Ir, Au, Ag, Re and Ni, 1$\leq$x$\leq$30, 1$\leq$y$\leq$30, 69$\leq$z$\leq$90 and 10$\leq$x+y$\leq$31 (unit of x, y, z: atomic %).

It is preferable that the magnetoresistance effect film has a multilayered structure having the soft magnetic layer, the non-magnetic metal layer, the ferromagnetic layer, the antiferromagnetic layer and a protective layer in the order named from a side of a substrate.

It is preferable that the magnetoresistance effect film has a multilayered structure having an under layer, the antiferromagnetic layer, the ferromagnetic layer, the non-magnetic metal layer and the soft magnetic layer in the order named from a side of a substrate.

It is preferable that hard magnetic layers for a magnetic domain control of the soft magnetic layer are disposed at both ends of the magnetoresistance effect film so as to be connected thereto, and that the hard magnetic layers are formed after formation of the magnetoresistance effect film and after applying the pulse magnetic field process to the magnetoresistance effect film, and the hard magnetic layers are magnetized such that a magnetization direction thereof is oriented substantially in the same direction as the magnetization direction of the soft magnetic layer at the time of the external magnetic field being zero.

It is preferable that hard magnetic layers for a magnetic domain control of the soft magnetic layer are disposed at both ends of the magnetoresistance effect film so as to be connected thereto, that the pulse magnetic field process is applied to the magnetoresistance effect film after completion as the head having the respective constituent members, and that the hard magnetic layers are magnetized after applying the pulse magnetic field process such that a magnetization direction thereof is oriented substantially in the same direction as the magnetization direction of the soft magnetic layer at the time of the external magnetic field being zero.

It is preferable that an inductive head portion for writing is provided as a constituent member of the head before applying the pulse magnetic field process.

It is preferable that a gimbal is provided as a constituent member of the head before applying the pulse magnetic field process.

BRIEF DESCRIPTION OF THE DRAWINGS

FIG. 4 is a sectional view for explaining a multilayered structure of a magnetoresistance effect film;

DETAILED DESCRIPTION OF THE INVENTION

Hereinbelow, the concrete carrying-out mode of the present invention will be described in detail.

A magnetoresistance effect type head (MR head) of the present invention is a spin valve head provided with a magnetoresistance effect film being a spin valve film.

Figure 1:
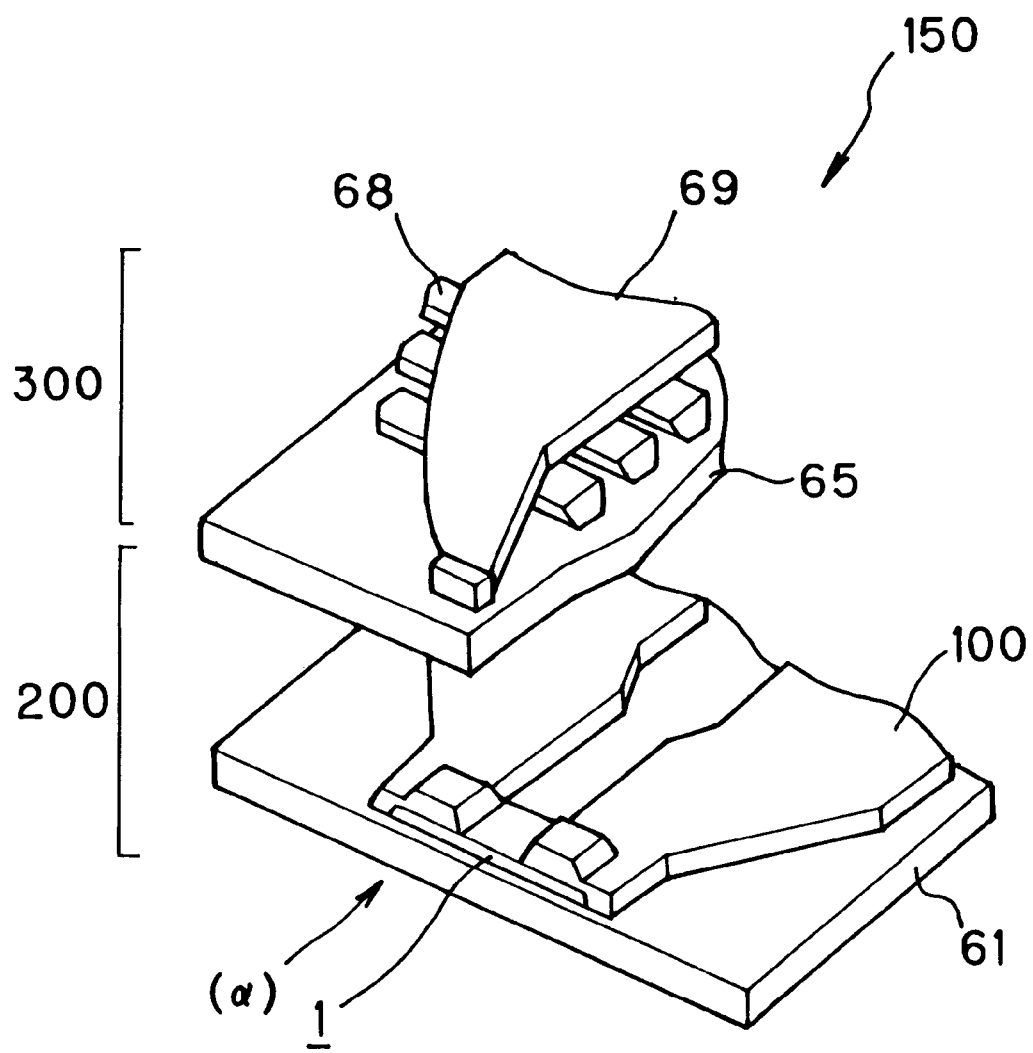
FIG. 1 is a schematic structural diagram of a composite head wherein an inductive head portion is added to a GMR head portion.

An MR head 150 shown in FIG. 1 is a composite head wherein a write-only inductive head portion 300 is added to a read-only GMR (giant magnetoresistive) head portion 200. The MR head 150 is also called an inductive-GMR head and has been becoming major. When referred to as "MR head", the read-only GMR head portion 200 is essential, while the write-only inductive head portion 300 may be omitted.

A structure of the MR head 150 shown in FIG. 1 will be described referring to constituent members thereof appearing in the drawing.

On a lower shield film 61, a magnetoresistance effect film 1 being a spin valve film is formed via a non-shown lower gap insulation film, and conductive films (leads) 100 are formed so as to be connected to the magnetoresistance effect film 1. On the conductive films 100, an upper shield film 65 is formed via a non-shown upper gap insulation film. The upper shield film 65 also has a function of a lower core of the inductive head portion 300. On the upper shield film 65, a thin film coil 68 and an upper core 69 are formed via a non-shown write gap film. The lower core 65 and the upper core 69, which are connected to each other behind in the drawing, form a closed magnetic circuit.

Figure 2:
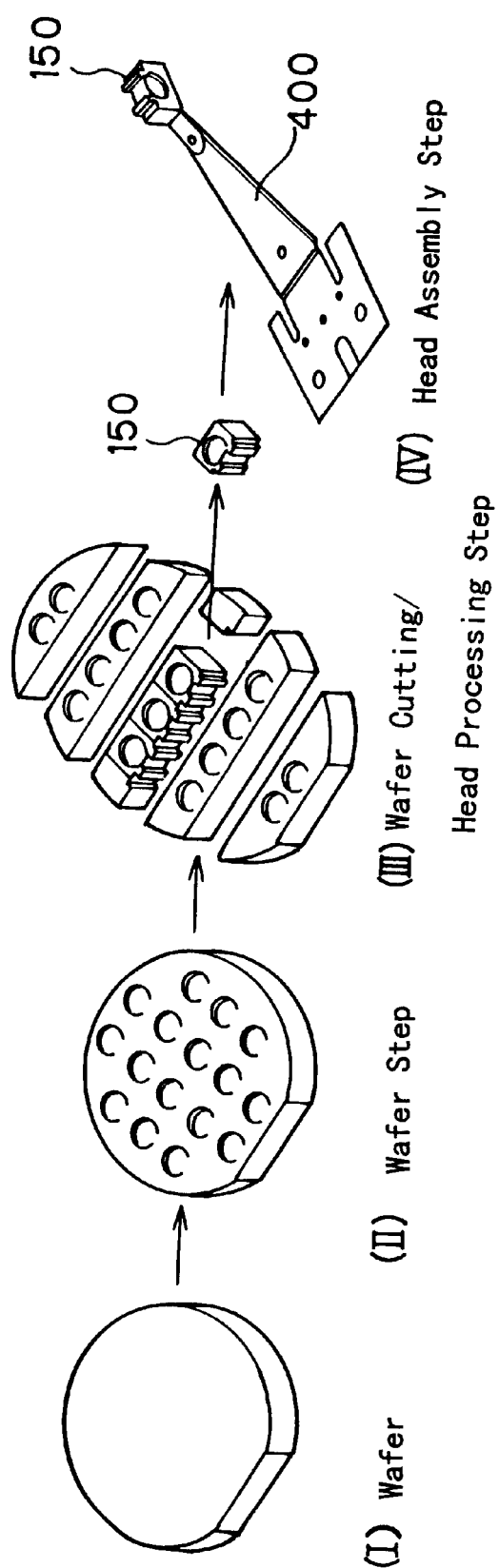
FIG. 2 is a diagram showing a schematic manufacturing procedure in a head manufacturing process.

The MR head 150 is manufactured according to, for example, a schematic manufacturing procedure (I) to (IV) in the head manufacturing process as shown in FIG. 2. Specifically, on a prepared wafer (FIG. 2 (I)), address formation is performed for obtaining a number of heads, then formation of a given multilayered thin film constituting heads and processing thereof are carried out to reach the state of FIG. 2 (II). Then, wafer cutting and head processing are carried out for obtaining individual heads (FIG. 2 (III)). The MR head 150 after the completion of wafer cutting and head processing is attached to a gimbal 400 in a head assembling step (FIG. 2 (IV)) and then incorporated in a hard disk drive.

The formation of the foregoing given multilayered thin film carried out in the foregoing wafer step (FIG. 2 (II)) will be described in detail based on FIGS. 3 to 7.

Figure 3:
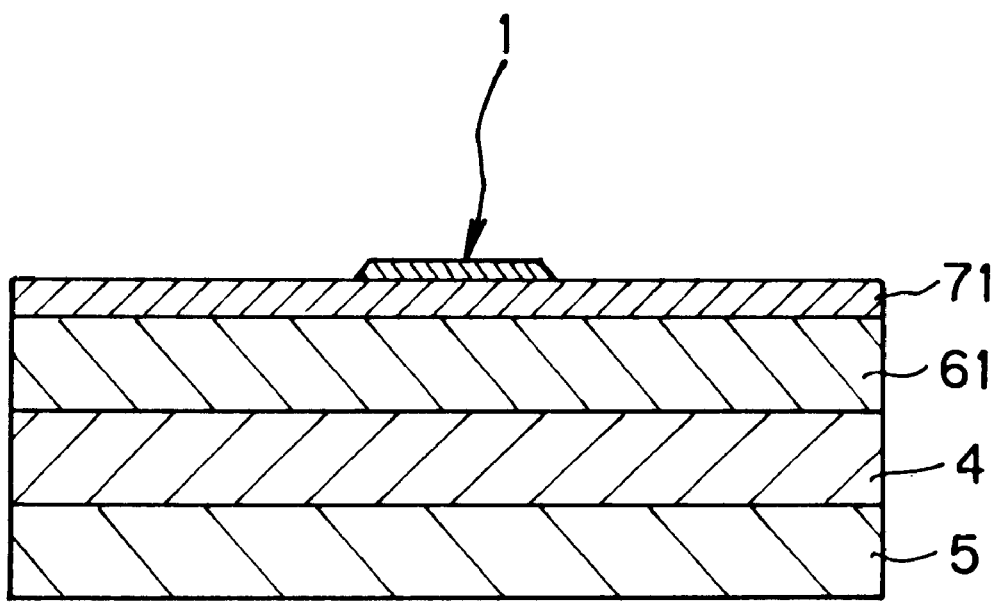
FIG. 3 is a sectional view for explaining a procedure of forming a multilayered thin film constituting the head.

FIG. 3 is a sectional view showing a state wherein the given multilayered thin film is being formed. FIG. 3 is a sectional view as seen in an arrow direction (α) of FIG. 1. In FIG. 3, a substrate protective layer 4, the lower shield layer 61, the lower gap insulation layer 71 and the magnetoresistance effect film 1 as the spin valve film are formed on a substrate 5 in the order named. In FIG. 3, the magnetoresistance effect film 1 is not shown in a multilayered state due to the size of the drawing, but actually has a multilayered structure as the spin valve film as shown in FIG. 4. Specifically, as shown in FIG. 4, the magnetoresistance effect film 1 has a non-magnetic metal layer 30, a ferromagnetic layer 40 formed on one surface of the non-magnetic metal layer 30, a soft magnetic layer 20 formed on the other surface of the non-magnetic metal layer 30, and an antiferromagnetic layer 50 which is formed on a surface of the ferromagnetic layer 40 remote from the other surface thereof abutting the non-magnetic metal layer 30 so as to pin the direction of magnetization of the ferromagnetic layer 40. Further, a protective layer 80 is formed on a surface of the antiferromagnetic layer 50 remote from the other surface thereof abutting the ferromagnetic layer 40, and an under layer 7 is formed on a surface of the soft magnetic layer 20 remote from the other surface thereof abutting the non-magnetic metal layer 30. The important point is that the magnetoresistance effect film 1 exhibits the so-called spin-valve type magnetoresistance change. The spin-valve type magnetoresistance change represents that, in a magnetic multilayered film having the non-magnetic metal layer 30, the ferromagnetic layer 40 formed on one surface of the non-magnetic metal layer 30, the soft magnetic layer 20 formed on the other surface of the non-magnetic metal layer 30 and the antiferromagnetic layer 50 formed on the ferromagnetic layer for pinning the magnetization direction of the ferromagnetic layer 40, the magnetization of the soft magnetic layer 20 is oriented in an x-axis direction in FIG. 4 while the magnetization of the ferromagnetic layer 40 pinned by the antiferromagnetic layer 50 is oriented in a z-axis direction (perpendicular to the sheet surface) in FIG. 4 when the external signal magnetic field is zero. Specifically, it is ideal that an angle formed between the magnetization direction of the soft magnetic layer 20 and the magnetization direction of the ferromagnetic layer 40 is set to 90 degrees in an acute angle so that the orthogonalization is achieved.

Conventionally, for achieving the orthogonalization of magnetization, the magnetoresistance effect film 1 is heated up to no lower than the blocking temperature Tb of the antiferromagnetic layer 50 and then subjected to a cooling treatment in the magnetic field so as to control the magnetization direction of the ferromagnetic layer 40. This process is called an orthogonalization process, and the temperature during the process is called an orthogonalization temperature. In the orthogonalization process, it is desired that only the magnetization direction of the ferromagnetic layer 40 be changed. In the conventional orthogonalization process, since the heating up to no lower than the blocking temperature Tb of the antiferromagnetic layer 50 is required for controlling the magnetization direction of the ferromagnetic layer 40, it is quite difficult to control the magnetization direction of the pinned ferromagnetic layer 40 within the angle range of 90±10 degrees relative to the magnetization direction (anisotropic magnetic field Hk) of the soft magnetic layer 20 at the time of the external magnetic field being zero.

When using an antiferromagnetic layer made of PtMn, NiMn or the like called a so-called regular phase antiferromagnetic material, since a heat treatment temperature for crystallization is high, the orthogonalization between the ferromagnetic layer 40 and the soft magnetic layer 20 is quite difficult.

In the present invention, by applying a given pulse magnetic field in the orthogonalization process, the ideal orthogonalization within the angle range of 90±10 degrees is realized. Specifically, the magnetization direction of the ferromagnetic layer 40 is pinned by the antiferromagnetic layer 50, and the magnetization direction of the pinned ferromagnetic layer 40 is forcibly controlled by a pulse magnetic field process so as to be substantially orthogonalized relative to the magnetization direction (anisotropic magnetic field Hk) of the soft magnetic layer 20 at the time of the external magnetic field being zero. In the pulse magnetic field process, a pulse magnetic field of a pulse magnetic field intensity I being 5 kOe to 40 kOe, preferably 8 kOe to 20 kOe, more preferably 10 kOe to 18 kOe is intermittently applied to the magnetoresistance effect film 1 while it is heated. If the pulse magnetic field intensity I applied in the pulse magnetic field process becomes less than 5 kOe, the foregoing ideal orthogonalization can not be realized. On the other hand, if the pulse magnetic field intensity I exceeds 40 kOe, a coil for generating the pulse magnetic field and a power supply therefor increase in size so that the cost is largely increased to lack practicality.

A pulse width t of the pulse magnetic field is preferably set in the range of 1 msec$\leq$t$\leq$500 msec. The pulse width t is rate-controlled by the specification of a pulse magnetic field generator, that is, the inductance of a pulse magnetic field generating coil. Specifically, there is a close relationship between the pulse width and the pulse intensity such that the pulse width is narrowed as the pulse intensity is increased. Considering the balance of the relationship therebetween, the pulse width t of the pulse magnetic field is preferably set in the range of 1 msec$\leq$t$\leq$500 msec as described above.

A pulse period $\lambda$ of the pulse magnetic field is preferably set in the range of 0.1 Hz$\leq$$\lambda$$\leq$10 Hz. Like the pulse width t, the pulse period $\lambda$ is rate-controlled by the specification of a pulse magnetic field generator, that is, the inductance of a pulse magnetic field generating coil and the performance of a power supply. If the value exceeds 10 Hz, charging can not come up with the need. On the other hand, if the value becomes less than 0.1 Hz, a process time is merely prolonged, thus uneconomical.

The pulse magnetic field process employed in the present invention is carried out in the state of the magnetoresistance effect film 1 being heated as described above. Given that the blocking temperature of the antiferromagnetic layer 50 is represented by Tb, the heating temperature range is 0.3 Tb to 0.6 Tb, preferably 0.3 Tb to 0.5 Tb. Accordingly, it is not necessary to raise a temperature up to the blocking temperature Tb as required conventionally. This is because the so-called orthogonalization process is carried out using the pulse magnetic field. If the heating temperature becomes less than 0.3 Tb, there is raised a disadvantage that even if the pulse magnetic field according to the present invention is applied, the sufficient orthogonalization of magnetization can not be achieved. On the other hand, if the heating temperature exceeds 0.6 Tb, deterioration of the head characteristic tends to be caused due to thermal deterioration or the like, thus not preferable.

Figure 8:
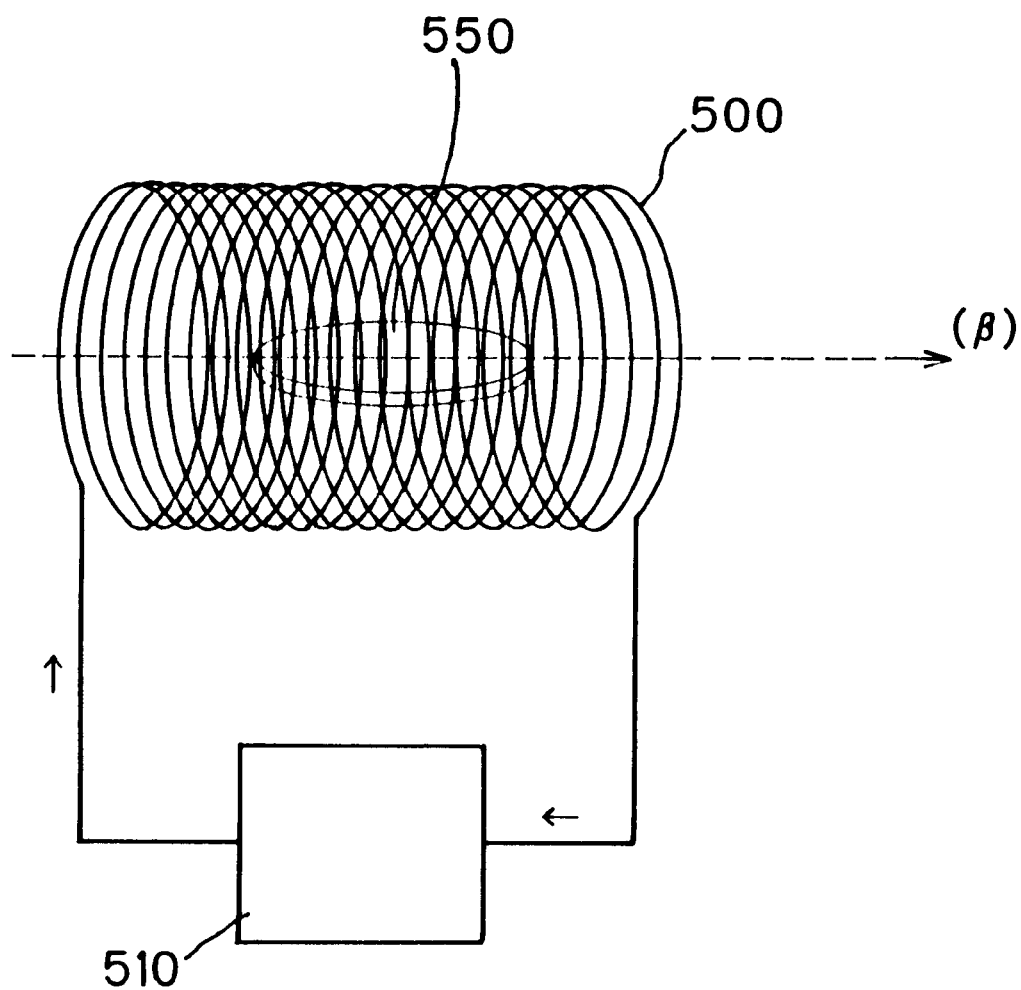
FIG. 8 is a conceptual diagram of a pulse magnetic field generator for carrying out a pulse magnetic field process.

FIG. 8 is a conceptual diagram of a pulse magnetic field generator for performing the pulse magnetic field process. Basically, a solenoid type coil 500 is provided and a power supply 510 for generating the pulse magnetic field is connected to the coil 500. In FIG. 8, an arrow ($\beta$) represents a pulse magnetic field direction. At the hollow center of the coil 500, a wafer 550 having the magnetoresistance effect film 1 is disposed such that a given orthogonalization process of the magnetoresistance effect film 1 can be carried out. Depending on the shape of the wafer 550, the shape of the coil 500 may be changed to an ellipse for facilitating insertion of the wafer. It is preferable that the coil 500 is put in a vacuum vessel which is then evacuated. However, depending on the heating temperature, the coil 500 may be disposed in the atmosphere. Further, instead of the state of the wafer 550, a substantially completed head with a gimbal may be inserted into the coil 500 and subjected to a pulse magnetic field process as described later. In this case, since the minimum required magnetic field and heat are enough for the pulse magnetic field process, the generator can be reduced in size and cost.

Now, the reason why the orthogonalization for causing the angle between the magnetization direction of the pinned ferromagnetic layer 40 and the magnetization direction of the soft magnetic layer 20 at the time of the external magnetic field being zero to approximate 90 degrees as much as possible, is required for the magnetoresistance effect film 1, and the detailed laminate structure of the magnetoresistance effect film 1 including materials thereof will be described.

In the magnetic multilayered film 1 (spin valve film), it is required that the soft magnetic layer 20 and the ferromagnetic layer 40 which are adjacently formed at both sides of the non-magnetic metal layer 30 have substantially different magnetization directions from each other in accordance with a signal magnetic field applied from the external. The reason is as follows: In the principle of the present invention, when the magnetization directions of the soft magnetic layer 20 and the ferromagnetic layer 40 which are formed via the non-magnetic metal layer 30 interposed therebetween are deviated from each other, conduction electrons have a behavior of scattering due to spins to increase its resistance. In this case, when the magnetization directions are opposite to each other, the maximum resistance is obtained. That is, in this invention, when a signal magnetic field from the external is positive (in an upward direction with respect to a recording surface 93 of a recording medium 90 (represented by reference numeral 92)) as shown in FIG. 9, there occur mutually opposite components in the magnetization directions of the neighboring soft magnetic layer 20 and ferromagnetic layer 40 so that the resistance is increased.

Here, the relationship among the external signal magnetic field from the magnetic recording medium, the magnetization directions of the soft magnetic layer 20 and the ferromagnetic layer 40 and the variation of electrical resistance in the (spin valve) magnetic multilayered film used in the magnetoresistance effect film of the present invention will be described.

Figure 9:
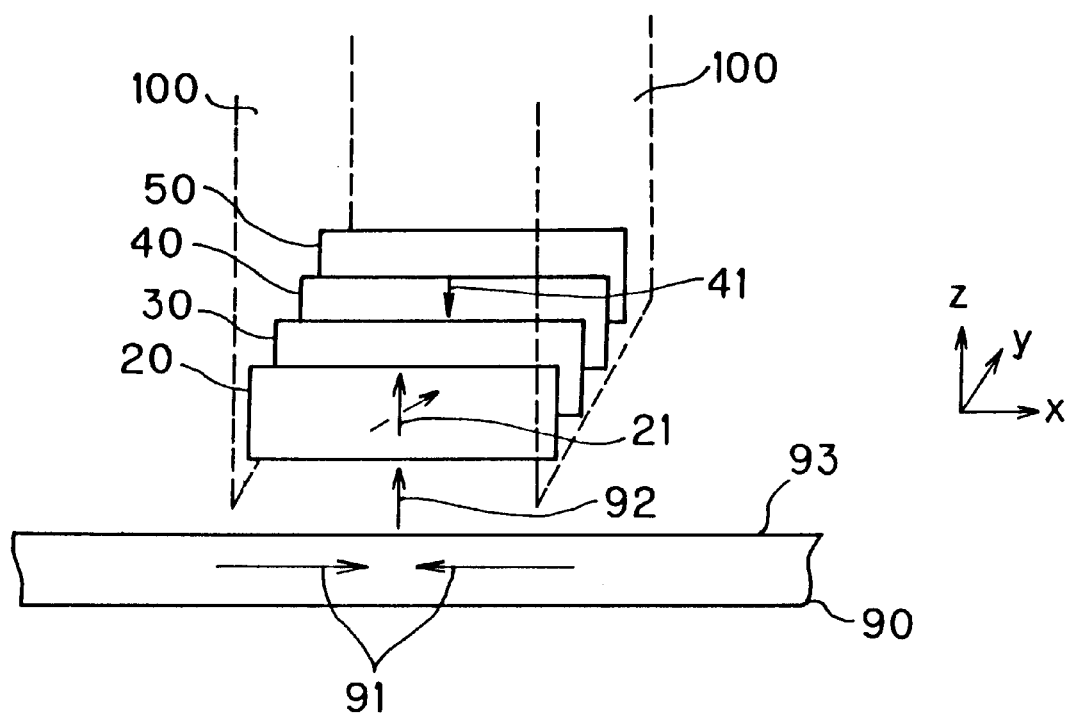
FIG. 9 is a schematic diagram showing a structure of the magnetoresistance effect film, particularly a magnetic multilayered film, for explaining an operation of the present invention.

Now, in order to facilitate the understanding of the present invention, the simplest magnetic multilayered film in which the pair of soft magnetic layer 20 and ferromagnetic layer 40 exist via the non-magnetic metal layer 30 as shown in FIG. 9 will be described.

In FIG. 9, the magnetization of the soft magnetic layer 20 at the time of the external magnetic field being zero is oriented in an x-axis direction (anisotropic magnetic field Hk). The magnetization of the ferromagnetic layer 40 is pinned by the antiferromagnetic layer 50 in a direction along a z-axis in FIG. 9, for example, in a downward direction to the surface of the recording medium, through the foregoing pulse magnetic field process (see reference numeral 41). Accordingly, the orthogonalization of magnetization therebetween is achieved. The soft magnetic layer 20 is formed via the non-magnetic metal layer 30 so that the magnetization direction thereof is varied in accordance with the signal magnetic field from the external (see reference numeral 21). At this time, the relative angle between the magnetization directions of the soft magnetic layer 20 and the ferromagnetic layer 40 is greatly varied in accordance with the direction of the signal magnetic field from the magnetic recording medium 90. As a result, the scattering degree of the conduction electrons flowing in the magnetic layers is varied, and thus the electrical resistance is greatly varied.

Accordingly, a large MR (magnetoresistive) effect, which essentially differs in mechanism from the anisotropic magnetoresistance effect of Permalloy, can be obtained. This is particularly called a GMR (giant magnetoresistive) effect.

It is preferable that the antiferromagnetic layer 50 in the present invention is substantially made of a material represented by $M_xMn_{100-x}$ with manganese (Mn) being essential, wherein M represents at least one selected from Ru, Rh, Re, Ir, Pt, Pd, Au, Ag, Fe, Ni and Cr, x takes a value in the range of $15 \leq x \leq 58$, and the unit of x is atomic %.

Among the foregoing materials of the antiferromagnetic layer 50, a material represented by $Ru_xM_yMn_z$ with manganese (Mn) and ruthenium (Ru) being essential is used for the antiferromagnetic layer 50 more preferably, wherein M represents at least one selected from Rh, Pt, Pd, Ir, Au, Ag and Re, $1 \leq x \leq 30$, $1 \leq y \leq 30$, $69 \leq z \leq 90$, $10 \leq x+y \leq 31$ (unit of x, y, z: atomic %). M in $Ru_xM_yMn_z$ generally represents one selected from the foregoing elements. In this case, the antiferromagnetic layer 50 is composed of three components, but may be composed of no less than four components in a particular case.

In the present invention, it is preferable that the concentration of oxygen contained in the antiferromagnetic layer 50 is regulated to 1 to 2,000 atomic ppm, preferably 1 to 1,000 atomic ppm, and more preferably 1 to 600 atomic ppm.

In the present invention, it is preferable that the antiferromagnetic layer 50 further contains carbon, sulfur and chlorine as impurities and that the concentration of carbon contained in the antiferromagnetic layer 50 is 1 to 2,000 atomic ppm, the concentration of sulfur 1 to 1,000 atomic ppm, and the concentration of chlorine 1 to 2,000 atomic ppm.

The thickness of the antiferromagnetic layer 50 is set to 5 to 100 nm, preferably 5 to 80 nm, more preferably 5 to 50 nm, still more preferably 5 to 30 nm. If the thickness of the antiferromagnetic layer 50 becomes smaller than 5 nm, the exchange coupling magnetic field Hua and the blocking temperature Tb are rapidly reduced. On the other hand, in case of being thicker, it is not so serious. However, if it is too thick, a gap length (a shield-shield length) of the MR head is so increased that it is not suitable for the ultrahigh density magnetic recording. Thus, it is preferably less than 100 nm.

The ferromagnetic layer 40 is formed of a metal element such as Fe, Ni, Co, Mn, Cr, Dy, Er, Nd, Tb, Tm, Ce, Gd, alloy or compound containing the above metal element. Particularly, it is preferably formed of a composition expressed by $(Co_zNi_{1-z})_wFe_{1-w}$ ($0.4 \leq z \leq 1.0$, $0.5 \leq w \leq 1.0$ by weight). Out of the composition range as described above, no large electrical resistance change can be obtained.

The thickness of the ferromagnetic layer 40 as described above is set to 1.6 to 10 nm, and more preferably 2 to 6 nm. If this value is smaller than 1.6 nm, it loses the characteristic as the ferromagnetic layer. On the other hand, if the value exceeds 10 nm, the pinning force of the antiferromagnetic layer 50 is reduced, and thus the sufficient pinning effect of the spin of the ferromagnetic layer can not be obtained.

As described above, since the ferromagnetic layer 40 is in direct abutment with the antiferromagnetic layer 50, a direct interlayer interaction acts on each other, and the rotation of the magnetization of the ferromagnetic layer 40 is prevented. On the other hand, with respect to the soft magnetic layer 20 as described later in detail, its magnetization can be freely rotated by a signal magnetic field from outside. As a result, a relative angle is produced in magnetization between the soft magnetic layer 20 and the ferromagnetic layer 40, so that a large MR effect due to the difference between the magnetization directions can be obtained.

The soft magnetic layer 20 is formed of Fe, Ni, Co or the like revealing soft magnetic characteristics, or alloy or compound containing these elements. The MR curve rises up more sharply by using the magnetic layer having a small coercive force Hc, and a favorable effect can be obtained. It is particularly preferable that the soft magnetic layer 20 has the following two-layer structure. Specifically, the soft magnetic layer 20 is formed as a two-layer laminate body comprising, from the side of the non-magnetic layer 30, a first soft magnetic layer and a second soft magnetic layer. The first soft magnetic layer is made of a simple substance of Co (cobalt) or an alloy containing Co no less than 80 weight %. The second soft magnetic layer has a composition expressed by $(Ni_xFe_{1-x})_yCo_{1-y}$ ($0.7 \leq x \leq 0.9$, $0.5 \leq y \leq 1.0$ by weight). With this arrangement, the first soft magnetic layer with Co being rich works as a diffusion blocking layer so as to prevent diffusion of Ni from the side of the second soft magnetic layer toward the non-magnetic metal layer 30. Further, since the first soft magnetic layer with Co being rich enhances the scattering of electrons, the MR change ratio is improved. The second soft magnetic layer is formed within the foregoing composition range for maintaining the soft magnetic characteristic.

The thickness of the soft magnetic layer 20 as described above is set to 2 to 15 nm, preferably 3 to 15 nm, and more preferably 5 to 15 nm. If this value is smaller than 2 nm, no excellent characteristic as the soft magnetic layer can be obtained. On the other hand, if the value exceeds 15 nm, the total thickness of the multilayered film is large and the resistance of the whole magnetic multilayered film is increased, so that the MR effect is reduced. When the soft magnetic layer 20 is in the form of the foregoing two-layer laminate body, it is sufficient to set the thickness of the Co-rich first soft magnetic layer to be no less than 0.4 nm.

In order to conduct electrons efficiently, a metal having conductivity is preferably used for the non-magnetic metal layer which is interposed between the soft magnetic layer 20 and the ferromagnetic layer 40. More specifically, it may be formed of at least one selected from Au, Ag and Cu, alloy containing 60 weight % or more of at least one of these elements, or the like.

The thickness of the non-magnetic metal layer 30 is preferably set to 1.5 to 4 nm. If this value is smaller than 1.5 nm, the soft magnetic layer 20 and the ferromagnetic layer 40 which are disposed through the non-magnetic metal layer are exchange-coupled to each other, so that the spins of the soft magnetic layer 20 and the ferromagnetic layer 40 do not function independently of each other. If this value exceeds 4 nm, the rate of the electrons which are scattered at the interface between the soft magnetic layer 20 and the ferromagnetic layer 40 disposed at the upper and lower sides respectively are reduced, so that the MR change ratio is reduced.

The protection layer 80 is provided to prevent oxidation of the surface of the magnetic film in a film-forming process and improve wettability with electrode material formed thereon and adhesive strength. The protection layer 80 is formed of Ti, Ta, W, Cr, Hf, Zr, Zn, Rh, Ru or the like. The thickness thereof is generally set to about 3 to 30 nm.

The material of each layer and the thickness thereof are specified as described above, and an external magnetic field is applied in a direction (x direction in FIG. 4) within the film surface as described later at the film formation time of at least the soft magnetic layer 20 to apply anisotropic magnetic field Hk of 2 to 20 Oe, preferably 2 to 16 Oe, and more preferably 2 to 100 Oe.

If the anisotropic magnetic field Hk of the soft magnetic layer is lower than 2 Oe, it is equal to the same degree of the coercive force, and no linear MR change curve can be substantially obtained in the vicinity of zero magnetic field, so that the characteristic as the MR element is deteriorated. On the other hand, if it is higher than 20 Oe, when this film is applied to the MR head or the like, the output is liable to be reduced and the resolution is reduced. The value Hk as described above can be obtained by applying the external magnetic field of 10 to 300 Oe at the film formation. If the external magnetic field is no greater than 10 Oe, it is too insufficient to induce Hk. On the other hand, if it exceeds 300 Oe, the effect is not improved although a coil must be designed in large size due to an occurrence of magnetic field. Therefore, the cost is increased and thus it is inefficient.

The foregoing magnetic multilayered film may be repetitively laminated to form a magnetoresistance effect film. In this case, the repetitive lamination frequency n of the magnetic multilayered film is not limited to a specific value, and it may be suitably selected in accordance with a desired magnetoresistance ratio, etc. In order to satisfy the present requirement for ultrahigh densification of the magnetic recording, the smaller total film thickness of the magnetic multilayered film is better. However, if the film is thinner, the MR effect is usually reduced. The magnetic multilayered film of this invention can be used in practice to a sufficient level, even when the repetitive lamination frequency n is 1. Furthermore, as the lamination frequency is increased, the magnetoresistance ratio increases while productivity is lowered. If n is excessively large, the resistance of the whole element is excessively low, and it is practically inconvenient. Therefore, usually, n is preferably set to 10 or less. The preferable range of n is 1 to 5.

The film formation of each layer of the foregoing magnetoresistance effect film 1 is performed by a sputtering method. An ultimate pressure in a vacuum film forming apparatus is set to $2 \times 10^{-9}$ Torr or less, preferably $8 \times 10^{-10}$ Torr or less, and more preferably $2 \times 10^{-10}$ Torr or less. This can lower the concentration of impurities within the magnetoresistance effect film 1. The ultimate pressure is defined as a pressure in the film forming apparatus before the start of film formation, and differs from a pressure upon film formation.

The range of the ultimate pressure of no more than $2 \times 10^{-9}$ Torr is a range which has not been proposed in view of improving the film quality. For accomplishing the condition of the ultimate pressure of no more than $2 \times 10^{-9}$ Torr, what is not carried out in general is required with respect to a sputtering apparatus. Specifically, it is necessary that vacuum seal portions be all metal gaskets, that the apparatus be all formed of stainless steel or aluminum, that degassing be carried out at high temperature under vacuum upon assembling the apparatus, that, during exhaust, the whole vacuum vessel be baked to high temperatures so as to thoroughly and forcibly discharge residual gas and $H_2O$, and that an exhaust pump operable under $2 \times 10^{-9}$ Torr or less be used.

Further, it is desired that the total concentration of impurities (for example, $H_2O$, $CO_2$ and He) in the sputtering gas introduced upon sputtering is set to 0.1 to 100 ppb, preferably 0.1 to 50 ppb, more preferably 0.1 to 10 ppb, and still more preferably 0.1 to 5 ppb.

An operating pressure in the vacuum film forming apparatus during actual film formation is normally set to $1 \times 10^{-4}$ to $1 \times 10^{-2}$ Torr.

When forming the antiferromagnetic layer 50, the magnetic field is preferably applied in a direction (z-axis direction) perpendicular to the direction of the magnetic field applied at the film formation time of the soft magnetic film 20. Specifically, it is applied within the film plane of the magnetic multilayered film and in a direction orthogonal to the measurement current. The magnitude of the applied magnetic field is preferably set in the range of 10 to 300 Oe. With this operation, the magnetization direction of the ferromagnetic layer 40 is surely fixed in the applied magnetic field direction (direction perpendicular to the measurement current) by the antiferromagnetic layer 50, whereby the magnetization of the ferromagnetic layer can be most reasonably set to be antiparallel to the magnetization of the soft magnetic layer 20 whose direction can be freely changed by the signal magnetic field. However, this is not a necessary condition, and the direction of the magnetic field to be applied at the film formation time of the antiferromagnetic layer may be coincident with the direction of the magnetization of the magnetic field to be applied at the film formation time of the soft magnetic layer. This is because, in the present invention, the foregoing pulse magnetic field process is carried out after the formation of the magnetoresistance effect film 1 for reliably achieving the orthogonalization.

Figure 10:
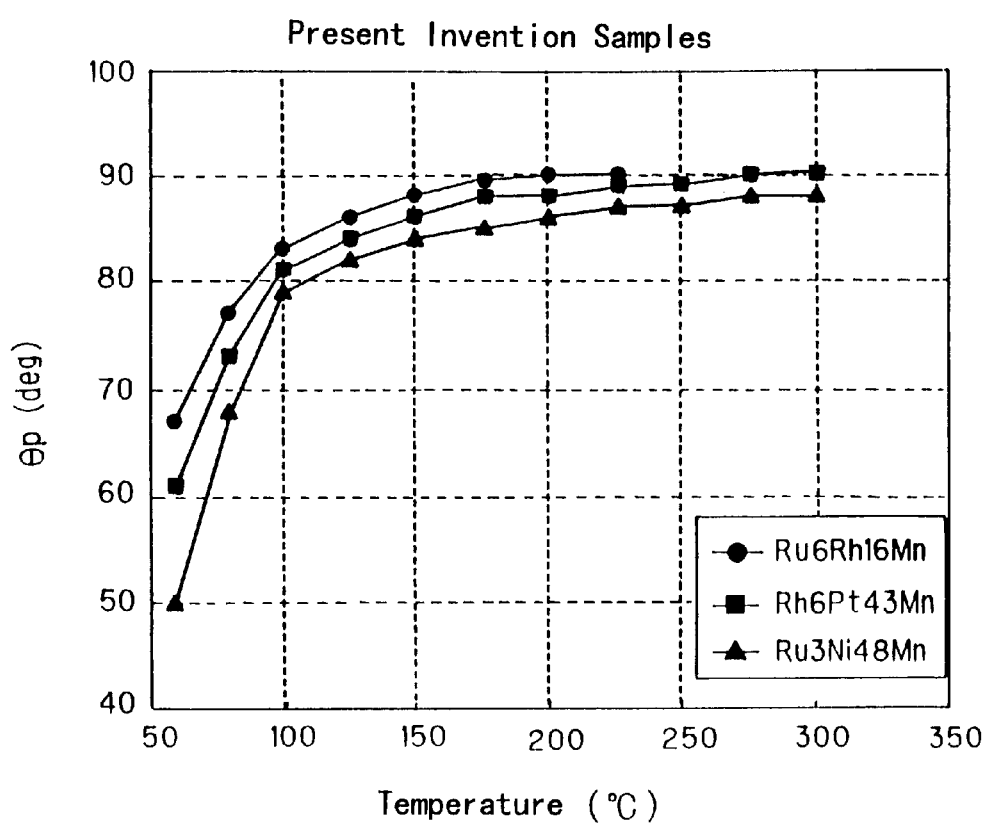
FIG. 10 is a graph showing the results of examining an influence of a heating temperature of the magnetoresistance effect film onto a pin direction angle Op when executing orthogonalization of magnetization through the pulse magnetic field process of the present invention.

One of the preferred timings when the orthogonalization of the magnetic field directions through the pulse magnetic field process of the present invention, that is, the process of orienting the magnetization direction of the ferromagnetic layer 40 in the z direction shown in FIG. 4 or 10 by the pinning of the antiferromagnetic layer 50, is carried out is just after the formation of the magnetoresistance effect film 1 as shown in FIG. 4. Specifically, the process is carried out before hard magnetic layers are formed at both ends of the magnetoresistance effect film 1 at a later step). The pulse magnetic field process is carried out within the foregoing given condition range.

Figure 5:
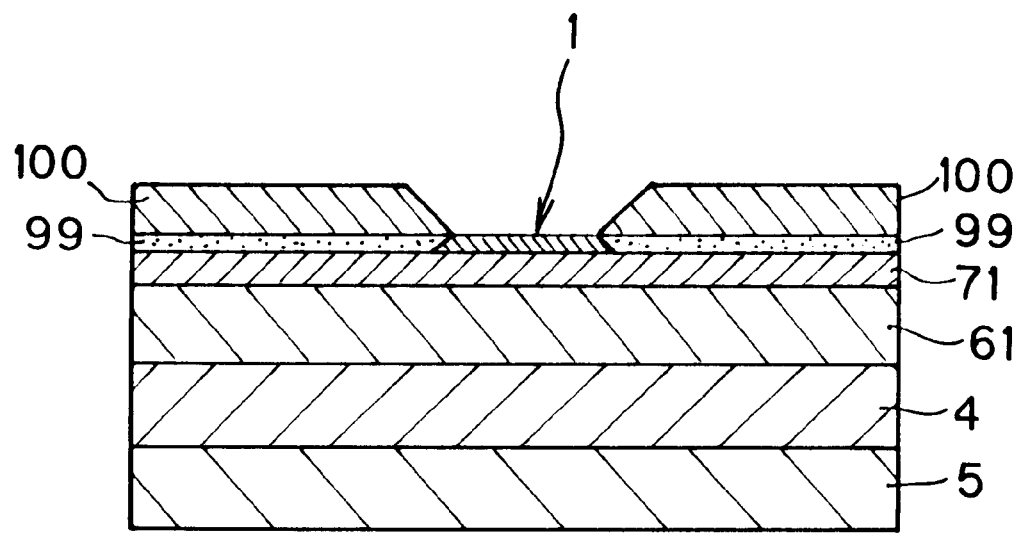
FIG. 5 is a sectional view for explaining the procedure of forming the multilayered thin film constituting the head.

After the orthogonalization of the magnetization directions of the soft magnetic layer 20 and the ferromagnetic layer 40 is realized within the angle range of 90±10 degrees through the pulse magnetic field process, hard magnetic layers 99, 99 are formed at both ends of the magnetoresistance effect film 1 and connected thereto as shown in FIG. 5. The hard magnetic layers 99, 99 are formed for a magnetic domain control of the soft magnetic layer 20. Therefore, the hard magnetic layers 99, 99 are, after the formation thereof, magnetized such that the magnetization is oriented in the same direction as the anisotropic magnetic field Hk of the soft magnetic layer 20, i.e. in the x direction in FIG. 4. On such hard magnetic layers 99, 99, conductive films 100, 100 are formed so as to be conductively connected to the magnetoresistance effect film 1. The conductive films 100, 100 are used for the wiring.

Figure 6:
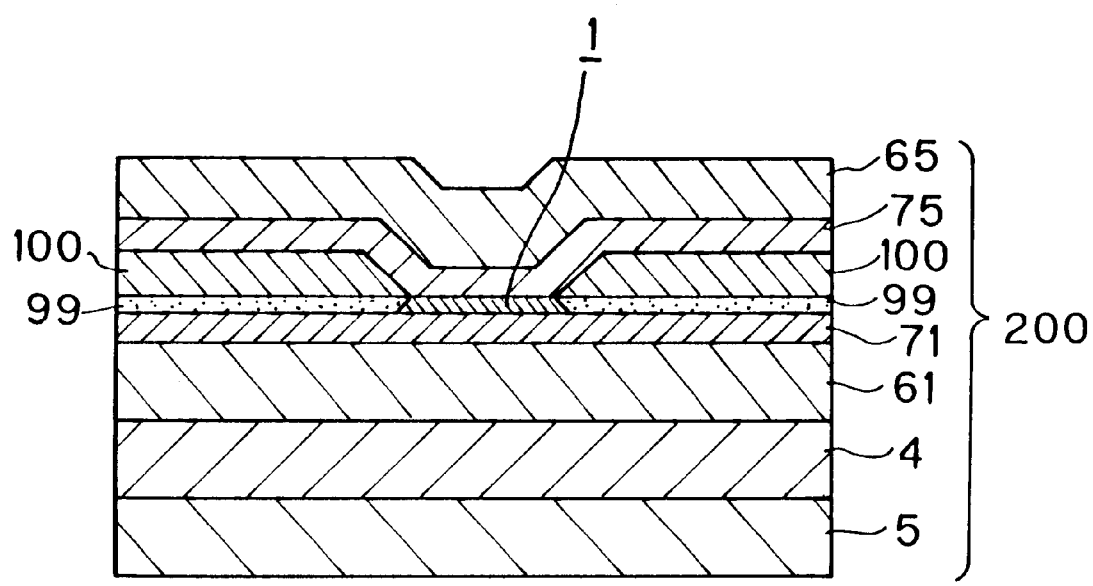
FIG. 6 is a sectional view for explaining the procedure of forming the multilayered thin film constituting the head.

Then, as shown in FIG. 6, an upper gap insulation film 75 is formed on the magnetoresistance effect film 1 and the conductive films 100, 100. The upper gap insulation film 75 and the foregoing lower gap insulation film 71 form a gap portion for reading of the magnetoresistance effect type head 150. On the upper gap insulation film 75 is formed the upper shield film 65. The magnetic shield is achieved by the upper shield film 65 and the foregoing lower shield film 61. The laminate structure in the state shown in FIG. 6 corresponds to the read-only GMR head portion 200 shown in FIG. 1. In this state, the GMR head is completed in outline.

Figure 7:
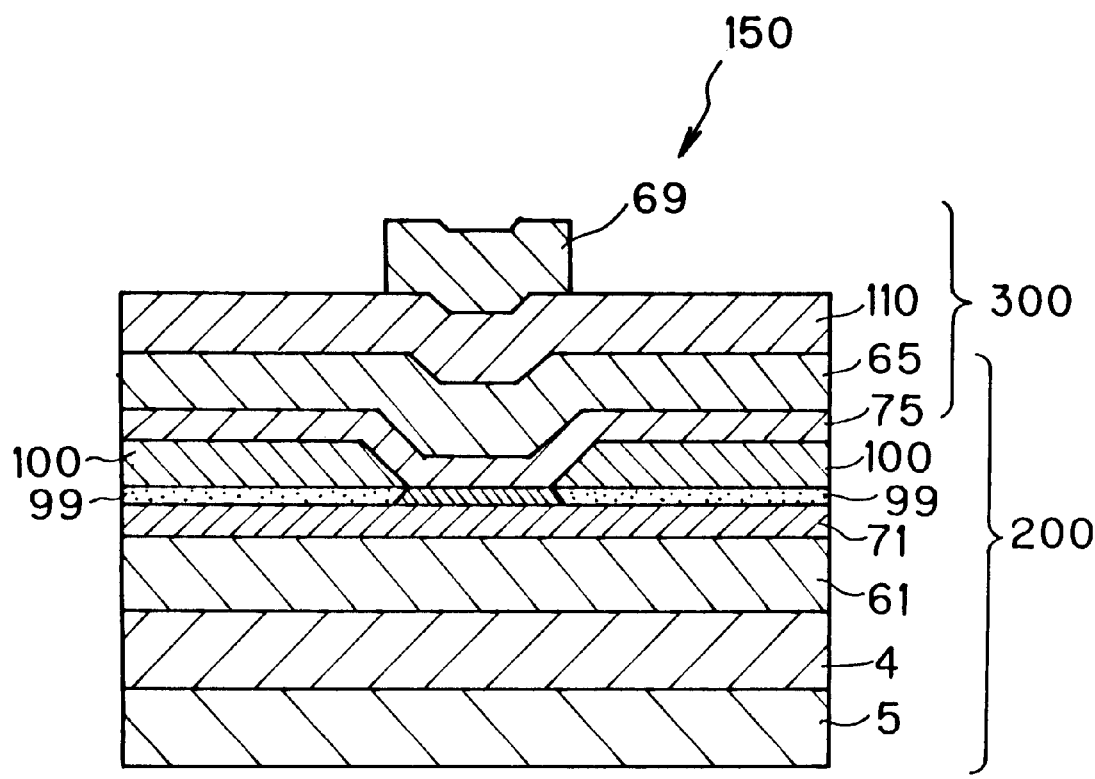
FIG. 7 is a sectional view for explaining the procedure of forming the multilayered thin film constituting the head.

In case of the composite head (inductive-GMR head) wherein the write-only inductive head portion 300 (FIG. 1) is added to the GMR head portion 200 as described above, the upper core 69 is formed via a write gap film 110 shown in FIG. 7 and the thin film coil 68 shown in FIG. 1. As described above, the upper shield film 65 also functions as the lower core 65 of the inductive head portion 300, and the closed magnetic circuit is formed by the lower core 65 and the upper core 69.

As shown in FIG. 2, the thus formed magnetoresistance effect type head 150 is subjected to the wafer cutting and the head processing, and is then attached to the gimbal 400 in the head assembling step (FIG. 2 (IV)) so that a so-called head-gimbal assembly is obtained. In another preferred process mode, the orthogonalization of the magnetic field directions through the pulse magnetic field process of the present invention is first applied to such a head-gimbal assembly. The pulse magnetic field process is carried out in the foregoing given condition range. Naturally, in this case, the pulse magnetic field process is not performed in the state immediately after the formation of the magnetoresistance effect film 1 (state of FIG. 3). In case the orthogonalization of the magnetic field directions through the pulse magnetic field process is carried out in the state of the head-gimbal assembly, the hard magnetic layers 99, 99 formed at both ends of the magnetoresistance effect film 1 are also magnetized in the same direction (z-axis direction) as the magnetization direction of the ferromagnetic layer 40. In this case, however, the hard magnetic layers 99, 99 may be magnetized again so as to orient in the same direction as the anisotropic magnetic field Hk of the soft magnetic layer 20 by applying an external magnetic field of, for example, about 3 kOe at a room temperature. Upon such magnetization, no influence is exerted on the magnetization direction of the ferromagnetic layer 40.

According to the method wherein the pulse magnetic field process is performed in the state of the head-gimbal assembly, since the spin valve orthogonalization is achieved after the completion of all heat processes for the head formation, the orthogonalization which has been ideally realized in the angle range of 90±10 degrees through the pulse magnetic field process is not disturbed thereafter. Further, the pulse magnetic field process in the state of the head-gimbal assembly can be carried out with the smaller process apparatus and with the reduced manufacturing cost. It is possible that due to. static electricity (ESD) during the head manufacturing process, a large ESD current flows locally through the spin valve head so that the magnetization direction of the pinned ferromagnetic layer is inverted. If the pin inversion due to the ESD occurs, the polarity of the head output is changed to cause a critical problem in view of an operation of the hard disk drive, resulting in that the hard disk drive becomes inoperative. If the orthogonalization of the magnetic fields is achieved through the pulse magnetic field process in the state of the head-gimbal assembly, it is not necessary to consider such a problem caused by the ESD in the head manufacturing process. According to such an aspect, the method of carrying out the pulse magnetic field process in the state of the head-gimbal assembly may be the best.

EXAMPLE 1

Experiment by Inventive Sample

A spin valve (SV) type magnetoresistance effect type head as shown in FIG. 6 was prepared in the following manner.

A laminate structure of the spin valve type magnetoresistance effect film 1 (see FIG. 4) was as follows. Specifically, the magnetoresistance effect film 1 was prepared by stacking, on a substrate (AlTiC with $Al_2O_3$), an under layer 7 (Ta; 5 nm in thickness), a soft magnetic layer 20 (NiFe; 7 nm in thickness), a non-magnetic metal layer 30 (Cu; 2.5 nm in thickness), a ferromagnetic layer 40 (Co; 3 nm in thickness), an antiferromagnetic layer 50 ($Ru_6Rh_{16}Mn_{78}$; 10 nm in thickness) and a protective layer 80 (Ta; 5 nm in thickness) in the order named. An external magnetic field was applied to the soft magnetic layer 20 in a direction (x direction in FIG. 4) within the film surface at the film formation so as to apply an anisotropic magnetic field Hk.

As shown in FIG. 6, hard magnetic layers (CoPtCr) 99, 99 were formed at both ends of the magnetoresistance effect film 1 so as to carry out a given magnetization process for a magnetic domain control of the soft magnetic layer 20. Then, conductive films (Ta) 100, 100 were formed thereon. For forming the magnetoresistance effect type head, an upper shield layer (Permalloy) 65 and a lower shield layer (Permalloy) 61 were formed via $Al_2O_3$ gap films 71 and 75 as shown in FIG. 6.

Upon the formation of the magnetoresistance effect film 1, the orthogonalization of the magnetization directions of the ferromagnetic layer 40 and the soft magnetic layer 20 was executed through the pulse magnetic field process. Specifically, the process was carried out to orient the magnetization of the antiferromagnetic layer 50 pinning the magnetization of the ferromagnetic layer 40 in a direction as close to 90 degrees as possible relative to the anisotropic magnetic field Hk of the soft magnetic layer 20.

The pulse magnetic field process was executed using a pulse magnetic field generator as shown in FIG. 8 and setting the pulse magnetic field intensity I to 10 kOe, the pulse width t to 10 sec and the pulse period λ to 0.2 Hz. By variously changing the heating temperature of the magnetoresistance effect film 1 upon performing the pulse magnetic field process, an influence of the heating temperature upon a pin direction angle θp (angle of the magnetization direction of the antiferromagnetic layer 50 relative to the anisotropic magnetic field Hk of the soft magnetic layer 20) was examined.

Similar experiments were carried out by changing the composition of the antiferromagnetic layer 50 to $Rh_6Pt_{43}Mn_{51}$ and $Ru_3Ni_{48}Mn_{49}$.

The results are shown in a graph of FIG. 10. As seen from the results shown in the drawing, by using the pulse magnetic field process, the orthogonalization in the angle range of 90±10 degrees is already realized in a very low heating temperature range of no lower than 110° C. Around 150° C., the orthogonalization in the angle range of 85 to 90 degrees is realized. As appreciated from this, if the pulse magnetic field process is used, not only the highly excellent orthogonalization can be realized, but also the process at a low temperature and for a short time (for example, about one minute) is possible. Thus, a thermal influence to the magnetoresistance effect film 1 can be small to prevent lowering of the magnetic characteristic, so that the spin valve film characteristic can be kept stable over a very long period.

Experiment by Comparative Sample

Figure 11:
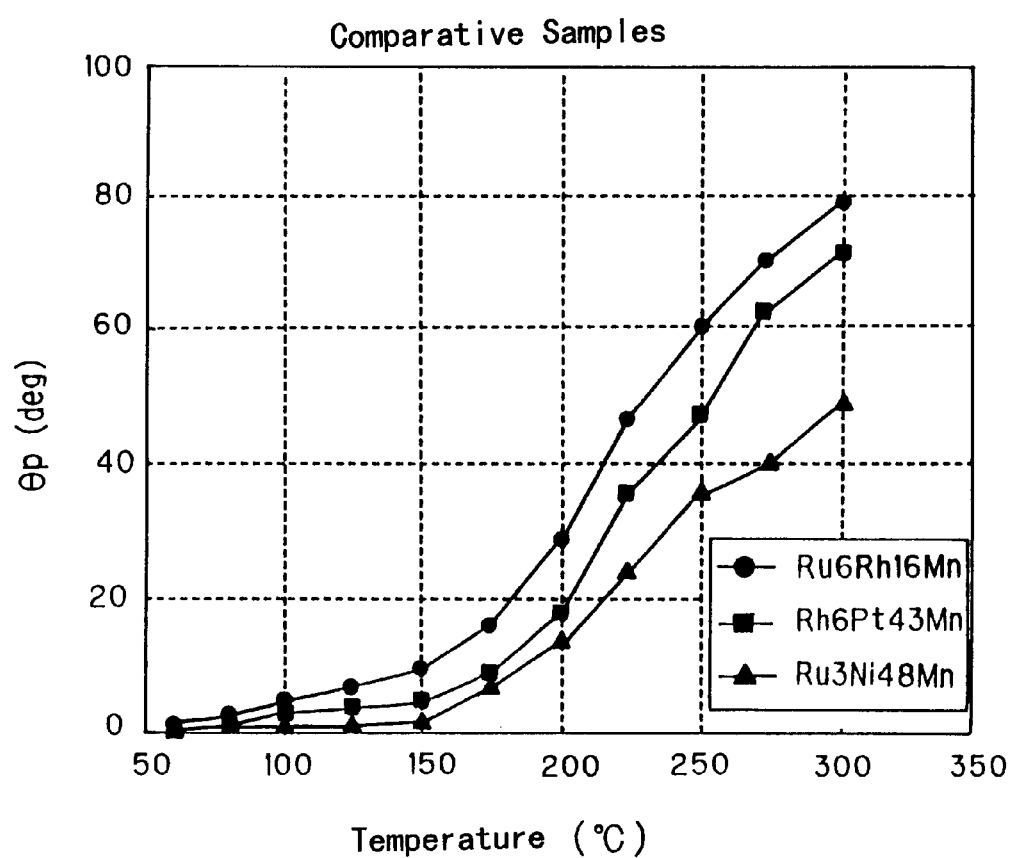
FIG. 11 is a graph showing the results of examining an influence of a heating temperature of the magnetoresistance effect film onto a pin direction angle Op when executing orthogonalization of magnetization according to a conventional method.

The conventional heat treatment in the magnetic field was carried out instead of the foregoing pulse magnetic field process so as to examine an influence of the heating temperature upon a pin direction angle θp. The results are shown in a graph of FIG. 11. As seen from the results shown in the drawing, according to the conventional heat treatment in the magnetic field, the heating no lower than 250° C. or 300° C.

is required for improving the orthogonalization even a little. Further, a long time (for example, about 2 hours) is necessary even at this high heating temperature. Such a high-temperature/long-time heat treatment induces lowering of the magnetic characteristic, and thus should be avoided if possible. The orthogonalization levels are also lower than those of the foregoing inventive samples.

EXAMPLE 2

Various samples to be used in Example 2 were prepared according to the preparation manner of the inventive samples in Example 1. The composition of the antiferromagnetic layer 50 was variously changed as shown in Table 1 below. In Table 1, Tb represents a blocking temperature of the antiferromagnetic layer 50, which is defined as a temperature at which an exchange coupling magnetic field relative to the ferromagnetic layer 40 becomes zero.

Influences of the pulse magnetic field process conditions (i.e. heating temperature T, pulse magnetic field intensity I, pulse width t and pulse period λ) onto pin direction angles θp and further onto head outputs were examined with respect to those samples.

The results are shown in Table 1.

the foregoing results, the effect of the present invention is clear. Specifically, the magnetoresistance effect type head of the present invention has the spin valve type magnetoresistance effect film, and the pulse magnetic field process is carried out wherein the pulse magnetic field of the pulse magnetic field intensity I of 5 kOe to 40 kOe is intermittently applied to the magnetoresistance effect film upon executing the so-called magnetization orthogonalization process. As a result, there can be obtained the magnetoresistance effect type head, wherein the orthogonalization of magnetization of the soft magnetic layer and the ferromagnetic layer is achieved under the very low temperature condition, i.e. without heating up to the blocking temperature Tb, and over a short time, so that deterioration of the magnetic characteristic is quite small, the head characteristic is stable and the head output is large.

What is claimed is:

1. A magnetoresistance effect head comprising a magnetoresistance effect film, conductive films and a gap portion,
   wherein said conductive films are conductively connected to said magnetoresistance effect film,
   wherein said magnetoresistance effect film is a spin valve multilayered film which comprises a non-magnetic metal layer, a ferromagnetic layer formed on one

TABLE 1

| Sample No. | Antiferromagnetic layer (m1, m2, m3) | (x, y, z) | Tb (° c.) | T (° c.) | T/Tb | I (kOe) | t (msec) | λ (Hz) | θp (deg) | Head output (mV) |
|---|---|---|---|---|---|---|---|---|---|---|
| II-1 | (Ru, Rh, Mn) | (3, 16, 81) | 260 | 80 | 0.31 | 10 | 15 | 0.2 | 88 | 860 |
| II-2 | (Ru, Rh, Mn) | (1, 20, 79) | 280 | 100 | 0.36 | 12 | 10 | 0.4 | 87 | 920 |
| II-3 | (Rh, Mn) | (22, 78) | 275 | 110 | 0.40 | 12 | 20 | 1.0 | 92 | 930 |
| II-4 | (Ru, Rh, Mn) | (4, 14, 82) | 260 | 80 | 0.31 | 10 | 8 | 1.0 | 88 | 840 |
| II-5 | (Ru, Pt, Mn) | (2, 47, 51) | 350 | 130 | 0.37 | 15 | 10 | 0.5 | 84 | 840 |
| II-6 | (Ru, Ni, Mn) | (3, 48, 49) | 370 | 150 | 0.41 | 15 | 10 | 0.5 | 86 | 820 |
| II-7 | (Ni, Pt, Mn) | (7, 45, 48) | 330 | 140 | 0.42 | 15 | 10 | 0.5 | 87 | 850 |
| II-8 | (Ru, Pt, Mn) | (6, 43, 51) | 350 | 170 | 0.49 | 15 | 10 | 0.5 | 90 | 920 |
| II-9 | (Pt, Mn) | (49, 51) | 360 | 110 | 0.31 | 18 | 8 | 0.2 | 82 | 950 |
| II-10 | (Ni, Mn) | (52, 48) | 400 | 160 | 0.40 | 18 | 8 | 0.2 | 87 | 910 |
| II-11 | (Pt, Mn) | (51, 49) | 370 | 150 | 0.40 | 7 | 20 | 0.2 | 82 | 960 |
| II-12 (comparative) | (Ru, Rh, Mn) | (4, 14, 82) | 260 | 70 | 0.27 | 10 | 8 | 1.0 | 65 | 400 |
| II-13 (comparative) | (Ru, Pt, Mn) | (4, 14, 82) | 260 | 120 | 0.46 | 3 | 8 | 1.0 | 60 | 380 |
| II-14 (comparative) | (Ru, Rh, Mn) | (6, 43, 51) | 350 | 90 | 0.26 | 12 | 10 | 0.5 | 30 | 330 |
| II-15 (comparative) | (Rh, Pt, Mn) | (2, 47, 51) | 350 | 80 | 0.23 | 15 | 10 | 0.5 | 25 | 300 |
| II-16 (comparative) | (Ni, Pt, Mn) | (7, 45, 48) | 330 | 70 | 0.21 | 15 | 10 | 0.5 | 20 | 240 |

(m1, m2, m3) represent constituent elements of an antiferromagnetic layer and (x, y, z) represent composition ratios (atomic %) of the constituent elements.

As seen from the results shown in Table 1, by intermittently applying the given pulse magnetic field intensity within the present invention to the magnetoresistance effect film, the pinning of θp=90±10 degrees is realized under the very low temperature condition of 30 to 60% of the blocking temperature Tb of the antiferromagnetic layer 50, and the very high head outputs can be obtained with the pinning of that range.

Further, in the sample pinned under such a very low temperature condition and over a short time, damage to the magnetic characteristic is small. For example, it was confirmed that there were no problems of the diffusion of substances between the laminate thin films forming the spin valve and of the loss of the anisotropic magnetic field Hk of the soft magnetic layer (free layer), so that the stable characteristic could be maintained over a long term. From surface of the non-magnetic metal layer, a soft magnetic layer formed on the other surface of said non-magnetic metal layer, and an antiferromagnetic layer which is formed on a surface of said ferromagnetic layer remote from a surface thereof abutting said non-magnetic metal layer so as to pin a direction of magnetization of said ferromagnetic layer,
   wherein said antiferromagnetic layer pins the direction of magnetization of said ferromagnetic layer,
   wherein the pinned magnetization direction of said ferromagnetic layer is forcibly controlled by a pulse magnetic field process so as to be substantially orthogonalized relative to a magnetization direction of said soft magnetic layer at the time of an external magnetic field being zero, said pulse magnetic field process intermittently applying a pulse magnetic field of a pulse magnetic field intensity I being 5 kOe to 40 kOe to said magnetoresistance effect film, and wherein the pinned magnetization direction of said ferromagnetic layer is in an angle range of 90±10 degrees relative to the magnetization direction of said soft magnetic layer at the time of the external magnetic field being zero.

2. The magnetoresistance effect head according to claim 1, wherein said pulse magnetic field process is carried out in a state of said magnetoresistance effect film being heated in a temperature range of 0.3 Tb to 0.6 Tb where Tb represents a blocking temperature of said antiferromagnetic layer.

3. The magnetoresistance effect head according to claim 1, wherein, in said pulse magnetic field process, a pulse width t is set in a range of 1 msec$\leq$t$\leq$500 msec and a pulse period $\lambda$ is set in a range of 0.1 Hz$\leq\lambda\leq$10 Hz.

4. The magnetoresistance effect head according to claim 1, wherein said antiferromagnetic layer is substantially made of $M_xMn_{100-x}$ where M represents at least one selected from Ru, Rh, Re, Ir, Pt, Pd, Au, Ag, Fe, Ni and Cr, and 15$\leq$x$\leq$58 (unit of x: atomic %).

5. The magnetoresistance effect head according to claim 4, wherein said antiferromagnetic layer is substantially made of $Ru_xM_yMn_z$ where M represents at least one selected from Rh, Pt, Pd, Ir, Au, Ag, Re and Ni, 1$\leq$x$\leq$30, 1$\leq$y$\leq$30, 69$\leq$z$\leq$90 and 10$\leq$x+y$\leq$31 (unit of x, y, z: atomic %).

6. The magnetoresistance effect head according to claim 1, wherein said magnetoresistance effect film has a multilayered structure having said soft magnetic layer, said non-magnetic metal layer, said ferromagnetic layer, said antiferromagnetic layer and a protective layer in the order named from a side of a substrate.

7. The magnetoresistance effect head according to claim 1, wherein said magnetoresistance effect film has a multilayered structure having an under layer, said antiferromagnetic layer, said ferromagnetic layer, said non-magnetic metal layer and said soft magnetic layer in the order named from a side of a substrate.

8. The magnetoresistance effect head according to claim 1, wherein hard magnetic layers for a magnetic domain control of said soft magnetic layer are disposed at both ends of said magnetoresistance effect film so as to be connected thereto, and wherein said hard magnetic layers are formed after formation of said magnetoresistance effect film and after applying said pulse magnetic field process to said magnetoresistance effect film, and said hard magnetic layers are magnetized such that a magnetization direction thereof is oriented substantially in the same direction as the magnetization direction of said soft magnetic layer at the time of the external magnetic field being zero.

9. The magnetoresistance effect head according to claim 1, wherein hard magnetic layers for a magnetic domain control of said soft magnetic layer are disposed at both ends of said magnetoresistance effect film so as to be connected thereto, wherein said pulse magnetic field process is applied to said magnetoresistance effect film after completion as the head having the respective constituent members, and wherein said hard magnetic layers are magnetized after applying said pulse magnetic field process such that a magnetization direction thereof is oriented substantially in the same direction as the magnetization direction of said soft magnetic layer at the time of the external magnetic field being zero.

10. The magnetoresistance effect head according to claim 9, wherein an inductive head portion for writing is provided as a constituent member of said head before applying said pulse magnetic field process.

11. The magnetoresistance effect head according to claim 9, wherein a gimbal is provided as a constituent member of said head before applying said pulse magnetic field process.

* * * * *